United States Patent [19]
Clemen et al.

[11] 4,122,361
[45] Oct. 24, 1978

[54] DELAY CIRCUIT WITH FIELD EFFECT TRANSISTORS

[75] Inventors: Rainer Clemen, Stuttgart; Werner Haug, Boblingen; Robert Schnadt, Stuttgart, all of Germany

[73] Assignee: International Business Machines Corporation, Armonk, N.Y.

[21] Appl. No.: 740,456

[22] Filed: Nov. 10, 1976

[30] Foreign Application Priority Data

Nov. 28, 1975 [DE] Fed. Rep. of Germany ....... 2553517

[51] Int. Cl.² .................... H03K 17/60; H03K 17/28; H03K 5/13; H03K 5/159
[52] U.S. Cl. ..................................... 307/208; 307/246; 307/251; 307/262; 307/269; 307/DIG. 4
[58] Field of Search ............... 307/208, 246, 251, 262, 307/270, 293, 268, DIG. 4

[56] References Cited

U.S. PATENT DOCUMENTS

| Re. 27,305 | 3/1972 | Polkinghorn et al. | 307/251 |
|---|---|---|---|
| 3,675,043 | 7/1972 | Bell | 307/208 X |
| 3,710,271 | 1/1973 | Putman | 307/205 X |
| 3,769,528 | 10/1973 | Chu et al. | 307/293 X |
| 3,806,738 | 4/1974 | Chin et al. | 307/251 X |
| 3,898,479 | 8/1975 | Proebsting | 307/246 X |
| 3,961,269 | 6/1976 | Alvarez, Jr. | 307/262 X |

OTHER PUBLICATIONS

West, "Practical Circuit Design Using M.O.S.", *Design Electronics* (pub.); Mar., 1971; vol. 8, No. 6; pp. 30-32, 37, 38.
Anderson et al., "FET Inverter and Driver Circuit", *IBM Tech. Discl. Bull.;* vol. 16, No. 1, pp. 50-51; Jun., 1973.
Boss et al., "Powering Delay Circuit", *IBM Tech. Discl. Bull.;* vol. 16, No. 1, pp. 17-18; Jun., 1973.

*Primary Examiner*—Larry N. Anagnos
*Attorney, Agent, or Firm*—Maurice H. Klitzman

[57] ABSTRACT

Utilization of a chip internal clock driver, for capacitive loads such as MOS circuits, which provides in response to an external clock phase adjustable and delayed secondary clock pulses. The delay circuit is an inverter circuit which uses a precharged coupling capacitor whose potential is dynamically increased (boosted) by capacitive coupling the input pulse to approximately twice the supply voltage and which capacitor is subsequently discharged by a constant current thus defining a delay time in a more extended and more precise range.

25 Claims, 11 Drawing Figures

DELAY CIRCUIT WITH FIELD EFFECT TRANSISTORS

FIELD OF THE INVENTION

The field of the invention relates to field effect transistor circuits and more particularly to field effect transistor delay circuits.

BACKGROUND OF THE INVENTION

Delay circuits are required in connection with a great variety of circuit applications. Accordingly, a great number of delay circuits are known which are designed for use with their respective operating conditions. A feature common to all delay circuits is that they supply, with a specific time delay at their output, an input signal they received. They differ according to the marginal operating conditions involved. These can be: the extent of the delay; varying setting range, the flexibility to receive all kinds of input signals; the circuitry technique or technology employed; etc.

Several clock pulses are frequently required for driving the numerous peripheral circuits such as decoder or selector circuits, flip-flops, etc. provided on a monolithically integrated FET storage chip. Supplying these several clock pulses from outside the chip places limitations on the number of chip connections, and results in pulse distortions or shifts on the supply lines. It is thus desirable not to supply all of these pulses to the chip from outside but to produce if possible all but on internally, i.e. on the respective chip. Thus, a chip internal clock driver has the general function of deriving from one single external clock pulse, or a clock pulse that already exists internally as the output signal of another driver, a second pulse which can drive—due e.g. to a large number of circuits to be driven (e.g. decoders)—a rather high load capacity (typical: 25 pF), and which is delayed with respect to the input signal by a predetermined time $t_d$.

It is known in that connection that in the least complicated case each FET switching stage, e.g. inverter, shows a delay. Delays on a given circuit field are therefore always achieved in that a capacitor or a capacitive component is charged or discharged via an FET or a comparable circuit element. It is also known that clock drivers with a non-inverted output can be realized by a series arrangement of two or, generally, an even number of standard inverters. As a typical value for the overall delay time $t_d$ of a two stage inverter series with field effect transistors approximately 10 ns can be assumed.

Since the delay circuits of the type discussed herein are based on the discharge of a capacitive element it would appear possible to obtain longer delay times by means of an increase of the effective capacitance value. However, there is the conflicting factor that with semiconductor circuits provided for monolithic integration this would have the direct consequence of increased area requirements which in turn is highly undesirable in most cases. If on the other hand the discharge current is reduced there appears the following problem: if while sensing a predetermined voltage level at the capacitive element, which voltage level determines the pulse delay, an FET or similar device is again used, its voltage is passed through very slowly, i.e. at a flat angle. This means, however, that this sensing circuit which advisably is identical with the output side inverter switches only slowly and thus can supply only a slow pulse rise to the circuits arranged in series to the delay circuit.

OBJECTS OF THE INVENTION

It is therefore an object of this invention to obtain longer predetermined delay times in a series arranged FET circuit where the actual delay stage supplies an output signal which rapidly passes through the switching threshold of a series arranged sensing circuit or output driver stage, so that the delayed output signal to be produced shows a steep initial rise.

It is another object of the invention to obtain a delay time independently of parameter variations of the circuit components, particularly of the threshold voltage of the field effect transistors.

It is another object of this invention to obtain longer delay times in semiconductor FET circuits by increasing capacitance but without increasing area requirements and reducing discharge current yet providing a fast pulse rise at the output.

SUMMARY OF THE INVENTION

The invention relates to a delay circuit with field effect transistors based on the discharge of a capacitive element caused by an input signal to be delayed, preferably a binary signal, with at least one input side switching stage representing the actual delay device, the capacitive element being effective at the output of said switching stage, and another switching stage designed as a voltage sensing device and as an output driver arranged in series to said switching stage.

DESCRIPTION OF THE DRAWINGS

These and other objects will become more apparent when read in the light of the accompanying specification and drawings.

DESCRIPTION OF PREFERRED EMBODIMENT

Figure 1:
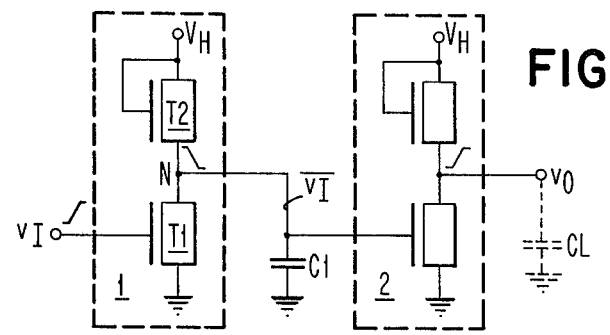
FIG. 1 shows a typical prior art delay circuit consisting of a series arrangement of two FET inverters.

The circuit arrangement of FIG. 1, which is typical for prior art in this field, makes use of the known fact that delay circuits with a non-inverting output can be realized by a series arrangement of two inverters. An input stage 1 inverts input pulse $v_I$ and drives an output side inverter 2 (e.g. of the same structure) which in turn once more inverts the inverted input pulse $\overline{v_I}$, so that from a logical point of view $v_0 = v_I$. The input stage 1 comprises a series arrangement of a driver FET T1 and of an associated load FET T2. The input signal $v_I$ to be delayed is applied to the gate electrode of T1 and appears in inverted form $\overline{v_I}$ at the common node N between the driver and load FET, which is also the output of such an inverter. Load FET T2, is shown with its drain and gate connected to operation voltage $V_H$. Voltage $V_H$ is e.g. with N-channel transistors a positive voltage, e.g. approximately 8.5 volts. At the output of the first inverter 1, a capacitive element C1 which is effective, exists as a discrete capacitor or also, which suffices in most cases, as the parasitic gate capacitance of the following stage. The output stage of inverter 2 is structured like input stage 1. The output signal $v_0$ is delayed with respect to input signal $v_I$ and is available for controlling further circuits represented in FIG. 1 by the capacitive load CL. Both inverters always involve a certain time delay, the typical value for N-channel FET technology being 10 ns approximately.

In order to achieve a higher overall delay time $t_d$, the partial delay time of input inverter 1 has to be increased, with the rise time of $v_0$ being manintained. However, this cannot be achieved by simply performing a re-dimensioning, because to achieve this effect driver transistor T1 should be of higher impedance. Together with load FET T2, and the voltage divider action to be considered therewith, this would lead to a slower but no longer complete discharge of capacitance C1 active at the output of input stage 1. The discharge waveform would be very flat so that the series arranged output stage 2 would transmit the waveform with a slow slope only. The output stage would then be too slow. There consequently exists the task of realizing a longer and, if possible, adjustable delay time $t_d$, but with the delay circuit supplying an output signal $v_0$ with a steep initial rise.

Figure 2:
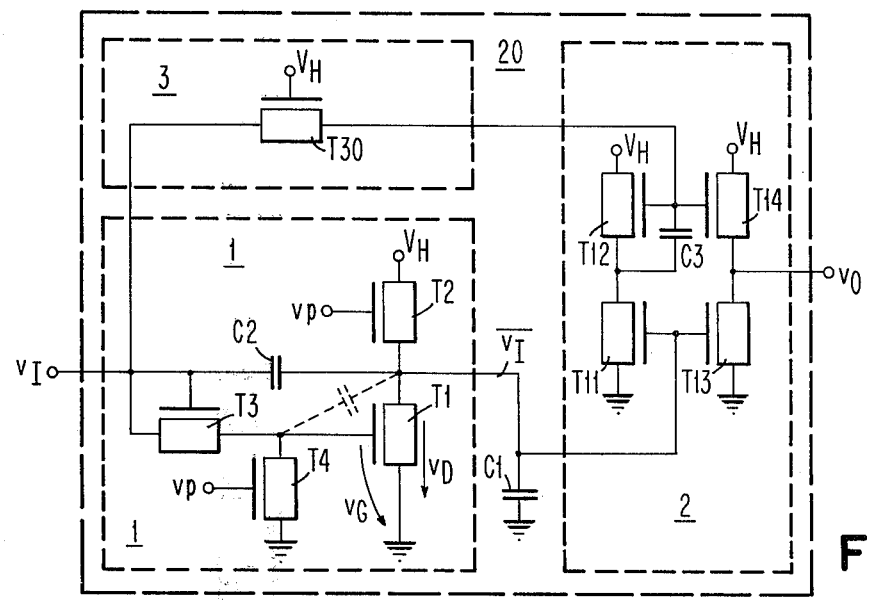
FIG. 2 shows a first embodiment of the invention.
Figure 3:
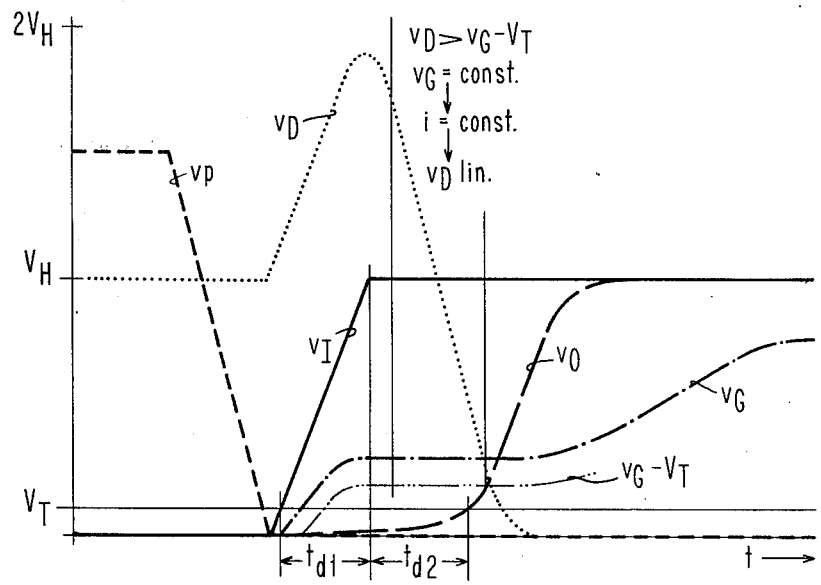
FIG. 3 is a schematic representation of the voltage curves in the embodiment of FIG. 2.
Figure 4:
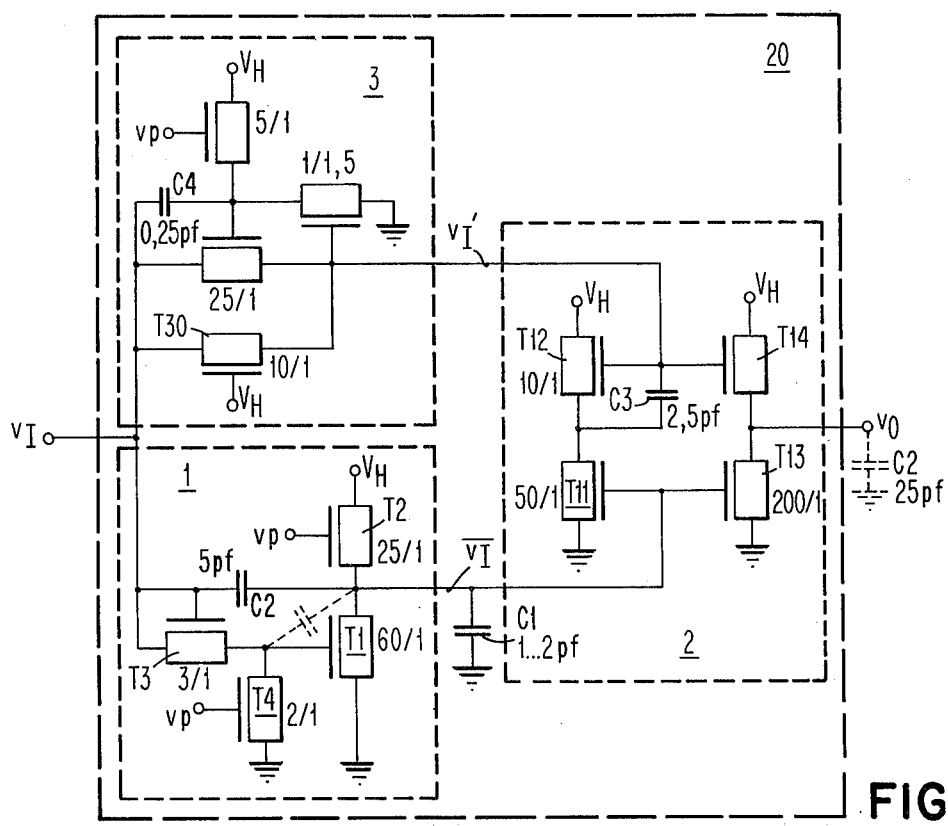
FIG. 4 is an embodiment of the invention further specified with respect to FIG. 2.

FIG. 2 shows an embodiment of the invention satisfying the above specified demands. The entire delay circuit 20 again comprises an input stage 1 which in the following will be called the actual delay stage, as well as an output or driver stage 2, and finally a switching stage 3 designated as an insulation stage and only generally represented in FIG. 2. The output driver stage 2 is known per se. Output driver stage 2 is an improved so-called bootstrap driver stage where the bootstrap capacitor C3 is provided in an unloaded condition. Similar inverter (transistors T11, T12) is arranged in parallel to the output inverter (transistors T13, T14). The charging of bootstrap capacitor C3 or the circuit node connected thereto, at the gate electrodes of T12 and T14 is carried out by the input signal $v_I$ via the then conductive insulation stage 3 (T30 conductive), and via conductive transistor T11. Subsequently, insulation stage 3 is non-conductive, so that the source voltage of T12 which rises upon the switching off of T11, sharply increases the gate voltage of the load FET's T12, T14 which results in a rapid rise of output pulse $v_0$. The output driver stage 2 shown in FIG. 2 and FIG. 4 is explained by means of the voltage diagrams of FIG. 3. The output driver stage 2 consists of the series connection of a transistor T13 forming the active element and of a transistor T14 forming the resistance element in the load circuit. The drain of transistor T13 and the source of transistor T14 are also connected to the common contact point which simultaneously forms output $v_0$ of the output driver 2. Again N-channel field effect transistors are used, so that the positive pole of operating voltage source $V_H$ is connected to the drain of transistor T14. The negative pole of the operating voltage source, i.e. ground, is connected to the source of transistor T13. The gate of transistor T13 is connected to the output of input stage 1. The output driver 2 comprises an additional series connected of two transistors T11 and T12 which parallel to the first series connection consisting of transistors T13 and T14, and are connected to operating voltage source $V_H$, whereby the gate of transistor T11 constituting the active elements, is connected to the gate of transistor T13 and thus to the output of input stage 1. Similarly, the gate of transistor T12 forming the resistance element is connected to the gate of transistor T14. The common contact point of the two additional transistors T11 and T12, and thus the source of transistor T12, is connected to the common gates of transistors T12 and T14 via a feedback capacitor C3. Therefore, the output driver stage 2 is an inverter stage comprising transistors T13 and T14 and an auxiliary inverter stage arranged parallel thereto and comprising transistors T11 and T12 from which a feedback signal is derived.

In the first operating stage, the capacitive load at the output $v_0$ is charged with transistors T13 and T11 being blocked. In the second operating state the capacitive load at the output $v_0$ is discharged with transistors T13 and T11 being conductive. Voltage $v_D$ (FIG. 2) occurring at the gate of T11 and T13 is below the threshold voltages of transistors T13 and T11 so that the latter are blocked. Via the insulating stage 3 used for both series connections, a sufficiently positive potential has been applied to gates of transistors T12 and T14, so that the output capacitive load is charged via transistor T14. At the time $t_{d1}$, a positive pulse corresponding to $\bar{v}_I$ is applied to the gates of T11 and T13. Transistor T13 becomes conductive, so that the output capacitive load is discharged via T13 to a value almost approaching that of the ground potential. As the voltages on source of transistor T14 and on source of transistor T12 reach values of almost zero (0), a relatively high voltage is otained on the two gate-source paths of transistors T14 and T12. During the application of the positive voltage from the output of input stage 1 to the gates of T11 and T13, this state is maintained.

As soon as the output voltage of input stage 1 is less than the threshold voltage of T13 and T11, transistors T13 and T11 are blocked. This causes the potentials of the common points between T11 and T12 and between T13 and T14 to rise. As with the usual dimensioning, the stray capacitance between T11 and T12 is essentially lower than the output load capacitance, the potential increases more rapidly than potential between T13 and T14 or voltage $v_0$ is identical to the latter. As the potential between T11 and T12 rises rapidly, the potential on the two gates of transistors T12 and T14 increases equally as rapidly as a result of the feedback through capacitor C3. This ensures that the gate potential of transistor T14 driving the output load increases more rapidly than the output voltage $v_0$. The thus increased gate source voltage across T14 leads to an increased current flow through transistor T14 and to the output load being charged more rapidly than would be the case with the T14 gate-source voltage remaining constant during charging.

Input stage 1 represents the actual delay stage improved in accordance with the invention. It again comprises a conventional FET inverter with driver FET T1 and its load FET T2. This circuit is similar to the corresponding circuit part of FIG. 1. The essential difference, with respect to FIG. 1, of FIG. 2 is that input signal $v_I$ is coupled via a coupling capacitor C2 to capacitor C1 at the output of the inverter. The input signal is also coupled to the gate electrode of the driver transistor T1. In the present case, this coupling is performed via the FET T3 having a relatively high impedance which with its drain-source path inserted between the input and the gate electrode of T1. In this embodiment the gate electrode of T3 is also connected to the input Furthermore, an FET T4 is connected to the gate electrode of T1 in such a manner that, at the beginning of a cycle which will be describd below, the gate of T1 can be discharged via this device.

The operation of the circuit in accordance with FIG. 2 will be described taking FIG. 3 into consideration. In FIG. 3, unchanged voltage values are marked with capital letters, and values changed with respect to time are marked with small letters, e.g. $V_H$, $V_T$, but $v_I$, $v_p$, etc. Prior to providing an input signal $v_I$ to be delayed, capacitor C1 is precharged to be operative at the output of delay stage 1, by means of voltage vp to a value (FIG. 3) that is as high as possible and preferably reaches the approximate operating voltage. In this precharging phase, the gate of T1 is simulaneously discharged via T4 to approximately ground potential. In the next phase which starts with the appearance of input pulse $v_I$, voltage $v_D$ at C1 is boosted to the value $v_D > v_G - V_T$, by means of the capacitive couplingin as provided in accordance with the invention, of the input signal via C2. This value is higher than the pulse amplitude of $v_I$ and much higher than gate voltage $v_G$ of FET T1. $V_T$ represents the value of the threshold voltage of T1. During this phase the partial delay time $t_{d1}$ in FIG. 3 is realized during which FET's T11 and T13 of the output driver stage are conductive and during which consequently output signal $v_0$ still shows the lower voltage value.

Via the high impedance FET T3 there subsequently takes place a delayed and slow rise of gate voltage $v_G$ of FET T1 to a lower value $v_G > v_D + V_T$. It is thus ensured that after switching the driver FET T1 operates for a long time in the saturated range. Consequently, C1 is discharged with constant current I, as desired, via T1 which (relative to T3 and T3) is of low impedance. Thus, a steep linear voltage curve $v_D(t)$ is obtained in accordance with the equation $$v_D(t) = \frac{1}{C1} \int I dt$$

up to the switching threshold of the series arranged output driver. This effect is obtained in that the trailing edge of the boosted voltage $\overline{v_I} = v_D$ is coupled back from the drain of FET T1 via the drain-gate capacitance represented in FIG. 2 in interrupted lines, to the gate of T1, and that thus the rise of $v_G$ which would otherwise be enforced from the input, i.e. from $v_I$, is compensated. It therefore follows that $v_G$ remains constant over an extended period of time. In this manner, partial delay time $t_{d2}$ is realized during which—until $v_D$ has reached the responding threshold of the output driver stage—T11 and T13 are still sufficiently conductive and $v_0$ therefore remains at the lower voltage level.

So far the description of the structure and operation of the invention was in accordance with the embodiment displayed in FIG. 2. It should be kept in mind that the invention initially provides a precharging of capacitor C1 to a maximum voltage, that owing to the capacitive coupling-in of the input signal the charge voltage is raised to a value higher than the operation voltage, after which a discharge of capacitor C1 takes place with a current of maximum constancy and defining the main delay time, with a steep but linear voltage course down to the switching threshold of the series arranged output driver used as a sensing circuit. Capacitor C1 in FIG. 2 is operative at the output of delay stage 1 and can be advantageously generated there directly by the gate capacities of T11 and T13. The voltage boosting through capacitive coupling-in of the input signal depends on the ratio of the capacitive values of C1 and C2.

For a maximum voltage boosting operation, the relationship C1 < C2 should apply. Typical approximate values are 1 to 2 pf for C1, at approximately 5 pf for C2.

FIG. 4 shows a delay circuit designed on the basis of FIG. 2, with actual component data. This representation gives in particular the W/L ratios for the individual field effect transistors, in view of which, in one case, the terms "high impedance" and in another case "low impedance" are used. The W/L ratio characterizes the ratio between the width and the length of the gate or channel area determining the transfer conductance of a field effect transistor. The higher the W/L ratio, the lower the impedance of the respective FET in the conductive state. The design and operation of insulation stage 3 is conventional per se the details of which follow.

FIG. 4 shows the insulation stage 3 which enhances the operation of the output driver 2. The improvement in the operation of the output driver 2 is achieved by a quicker charging of feedback capacitor C3 to a higher final value. The gate potential of field effect transistor T3 effecting the charging of C3 is no longer fixed to $V_H$, but controlled via components C4, T4 and T5. Through the further coupling capacitor C4, the gate voltage of T3 ($v_G$) can rise far above $V_H$. The voltage driver made of transistors T4' and T5' serves on the one hand for charging coupling capacitor C4 to a bias, so that upon the rising of $v_I$, the gate of T3 is given a dynamically increased potential, $v_G$. However, after the charging of feedback capacitor C3 to potential $v_G$, the gate voltage of T3 ($v_G$) has to decrease again to $v_G + v_G$ at least so as to render T3 a non-conductive. It is only in this manner that the feedback of the voltage between T11 and T12 to the gate of T12 can be realized, i.e. a discharge from C3 via T3 in this phase has to be reliably prevented. The lowering of the gate potential of T3 is effected via FET T5T3, of the voltage divider made of T4 and T5, to ground reference voltage. The gate voltage of T5 can be selected as a function of gating voltage $v_I$, i.e. that it can for instance equal $v_I$. Maximum speed charging of C3 is to take place via T3, and upon the completed charging of C3, T3 is to be reliably non-conductive to prevent discharge via T3. In parallel to T3 another FET T3 is shown whose gate is connected to $V_H$. Subsequent to the provision of the output pulse, the discharge of feedback capacitor C3 is possible via T3. By means of the switching stage 3, feedback capacitor C3 is charged more quickly, on the one hand, and on the other to a higher voltage value.

In comparing the circuit in FIG. 4 with an identical conventional circit, with the exception of delay stage 1, the delays obtained by the invention were up to five times longer, or with a dimensioning to the same delays, much steeper output pulses could easily be reached. The superiority of the circuit made in accordance with this invention is due to the flexibility obtained through the voltage boosting due to the capacitive coupling-in of the input signal with respect to the subsequent discharge determining the actual delay time, or the rise of the output pulse.

Figure 5A:
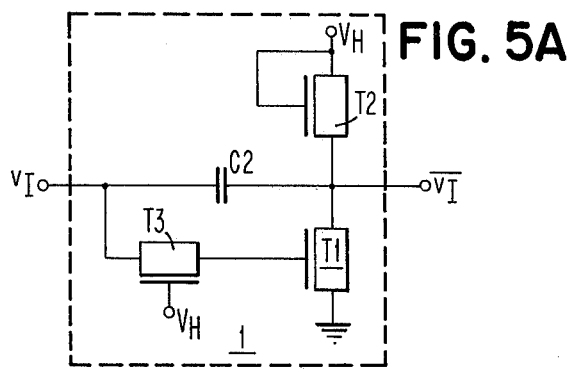
FIGS. 5A-5F show a list of advantageous embodiments of the delay stage as disclosed by the invention, for a static or a dynamic operation.
Figure 5B:
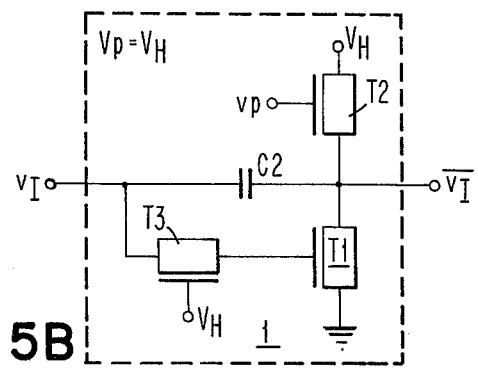
Figure 5C:
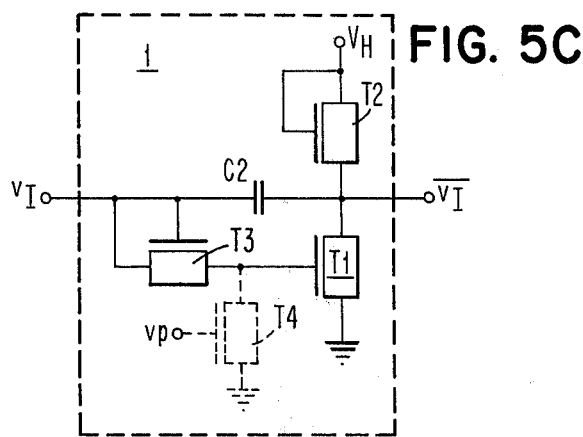
Figure 5D:
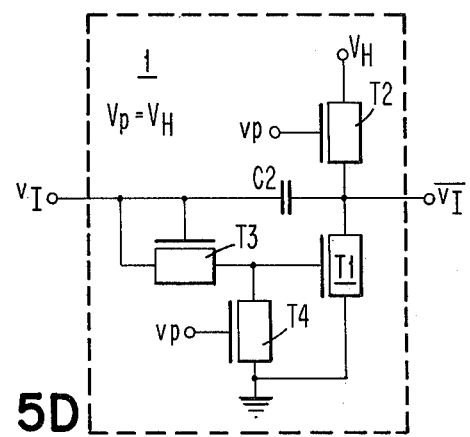
Figure 5E:
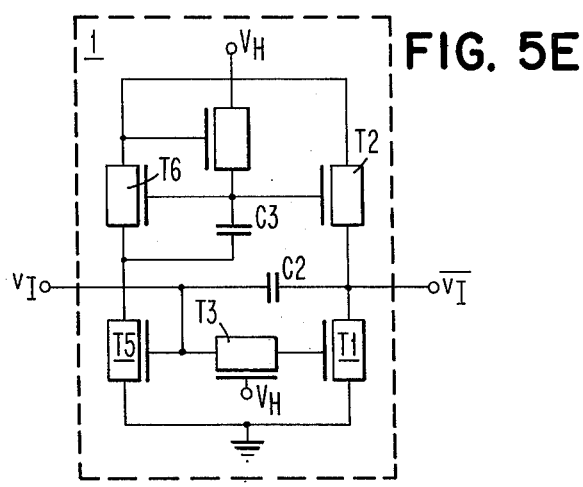

In FIGS. 5A-5F, various advantageous embodiments of delay stages as disclosed by the invention are assembled. All of these versions are based on a conventional FET inverter with FET's T1 and T2 being designed as a delay stage. FIGS. 5A, 5C, and 5E represent embodiments with static operation, with the corresponding dynamically operated delay stages being shown in FIGS. 5B, 5D and 5F. In static operation, there is a continuous flow of current if $v_I = V_H$, because the load FET T2, in the given manner, is applied to operation voltage $V_H$ with respect to its gate electrode. In this type of operation, no additional clock pulse is required, contrary to the dynamic operation. In the dynamic circuits, there is no DC power dissipation when driver FET T1 is conductive because the load FET T2, which is required for the precharge phase, is applied at its gate electrode only during this phase with voltage $vp$ which is limited with respect to time. A feature common to all embodiments of FIGS. 5A–5F is that in accordance with the invention a capacitive coupling-in of input signal $v_I$ to the capacitance at the output of the inverter is provided.

The circuits shown in FIGS. 5A–5F differ in the addressing of FET T3 in the gate supply line of T1, and in the voltage obtained after the termination of the precharging of the capacitor at the output of the inverter. The circuits shown in FIGS. 5A to 5D have the common feature that for the precharge of the capacitor at the output of the inverter via load FET T2 a voltage of the amount of operation voltage $V_H$ is available, continuously or temporarily, at its gate electrode. Consequently, the maximum precharge voltage is the operation voltage $V_H$ reduced by the value of the threshold voltage of T2. This voltage value is then raised by the capacitive coupling-in of input signal $v_I$ via C2, in accordance with the amplitude of $v_I$ and the divider ratio of C1 and C2. The circuit designs in accordance with FIGS. 5A and 5B differ from those in accordance with FIGS. 5C and 5D by the driving of FET T3. When in accordance with the above described embodiments in accordance with FIG. 2 and FIG. 4, the gate electrode of T3 is connected (FIGS. 5C, 5D) with the latter's drain electrode, or with the input terminal, T3 will only be conductive when input pulse $v_I$ exceeds threshold voltage $V_T$. This manner of switching T3 is therefore especially suitable for realizing a considerable overall delay. However since T3 prior to the appearance of input pulse $v_I$, is first non-conductive, FET T4 has to be provided for the discharge of the gate of T1. This necessary circuit step is superfluous when in accordance with FIGS. 5A and 5B (and also FIGS. 5E and 5F) the operation voltage is for instance applied at the gate electrode of T3. In these cases, the initial condition under which the gate of T1 is discharged is already ensured through the lower voltage level of $v_I$ prior to the appearance of the input pulse.

Figure 5F:
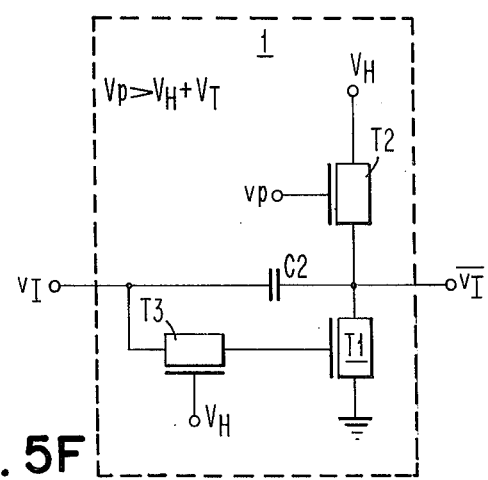

The circuits of FIGS. 5E and 5F have the common feature that contrary to the other four embodiments shown, they guarantee a precharge of the capacitor at the output to the full operation voltage value $V_H$ to which the voltage boosting due to the input pulse is added. Thus, a still higher initial voltage at the capacitor which was formerly designated C1 is achieved. However, in the version of FIG. 5F, this requires a voltage $V_p > V_H + V_T$, i.e. a voltage that is increased relative to the operation voltage. In many applications, the demand for a further voltage source will be considered a strong restriction. Consequently, FIG. 5E provides an advantageous embodiment for this case, where the input-side inverter designed as a delay stage is already structured as a bootstrap stage. With regard to the structure of this stage, reference is made to the above specifications with respect to the output driver stage 2 in FIG. 2 and FIG. 4. The main feature is in providing with the inverter with T1 and T2, a parallel, unloaded inverter equipped by means of bootstrap capacitor C3 and comprising T5 and T6. Thus, in the circuit of FIG. 5E, charging to the full value of the operation voltage is achieved without a higher external voltage being required.

Figure 6:
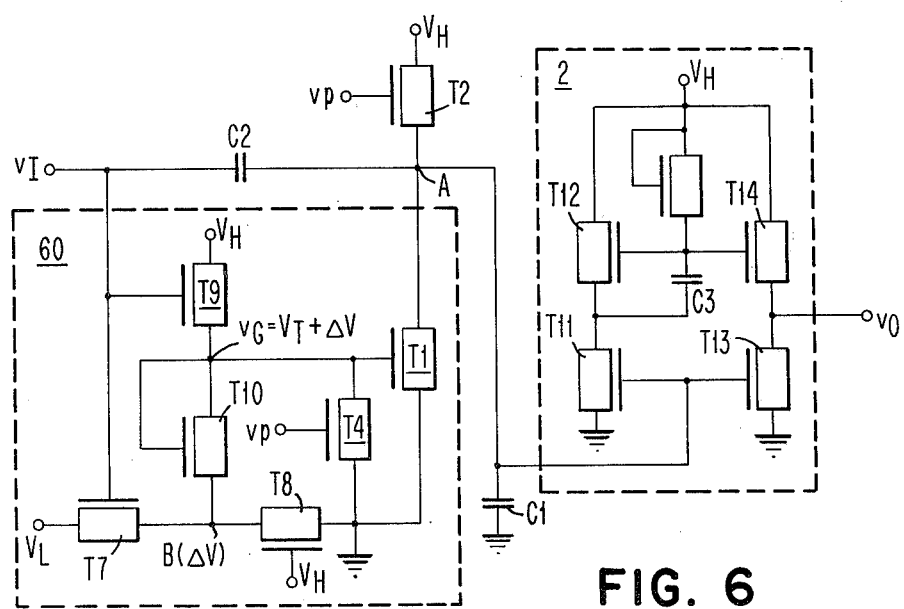
FIG. 6 is another embodiment of the invention where the delay to be realized is maintained independently of threshold voltage variations.

By means of the embodiment of FIG. 6, an advantageous development of the invention will finally be described. It particularly considers the specific situation in a monolithic integration of the delay circuit as disclosed by the invention. As explained above, the delays are in general reached in that a capacitor is charged or discharged via an FET. As capacitances generally show only low manufacturing tolerances and small temperature and voltage dependency, they are quite suitable as time determining components. The conditions of a field effect transistor are much more unfavorable as a charge or discharge element. The theshold voltage $V_T$ of field effect transistors can only be established with large manufacturing tolerances, and is additionally subject to considerable variations in operation, which results in a strong change of the transfer impedance of the charge or discharge transistor. There consequently follows a high tolerance of the RC time constants and thus of the delay time reached.

FIG. 6 shows a circuit 60 keeping constant the discharge current for capacitor C1—irrespective of the threshold voltage of the discharge FET T1—in order to ensure a constant delay time between two pulses $v_I$ and $v_O$. Furthermore, a maximum ouput charge voltage of the capacitor is to be assumed in order to permit a quick passage over the switching threshold of sensing circuit 2 and therefore a steeper initial pulse rise.

FIG. 6 uses components that are comparable to earlier embodiments of the invention and have the same designations. During the precharge phase preceding the actual delay function charge pulse $vp$ appears on its upper voltage at N-channel FET T2 and pulse $v_I$ to be delayed on its lower voltage value, e.g. ground potential. T1 is therefore not conductive. Capacitors C1 (line and input capacitance of sensing or output driver stage 2) and C2 are charged via T2 to the value of operation voltage $V_H$ when—as it is to be assumed—$vp$ is on a correspondingly high value ($V_p > V_H + V_T$). When subsequently vp sinks to the lower voltage again the circuit is ready for operation. With the rise of input pulse $v_I$, the already described voltage boosting will appear at point A due to the capacitive coupling-in of $v_I$ via capacitor C2, which voltage boosting, according to the circuit made in accordance with this invention, can rise to almost twice the amount of operation voltage $V_H$. Now, the capacitances are discharged by means of the circuit section marked 60 in FIG. 6. In accordance with its function, this circuit section 60 can be called a circuit for supplying a gate voltage for the discharge FET T1 which circuit is compensated with respect to variations of threshold voltage $V_T$. T7 and T8 form a voltage divider provided between a voltage $V_L$ (lower than $V_H$) and ground, and switched by input signal $v_I$, a relatively low constant voltage $\Delta V$ being available at switching point B. Between the above switching point B and operation voltage $V_H$, there are the series arranged FET's T9 and T10. T10 is connected as a diode and should in its parameters be a relatively good simulation of discharge FET T1, which should be noted in particular. T9 is also switched by input signal $v_I$. The FET T4 serves, as described in connection with the above embodiments, to discharge the gate T1 in the charging phase.

When input pulse $v_I$ appears, this circuit supplies at the gate of T1 a voltage of $V_T + \Delta V$, $V_T$ being the threshold voltage and $\Delta V$ the already specified constant voltage adjustable by dimensioning, at switching point B. The difference between the gate source voltage ($v_{GS}$) and the threshold voltage of T1 is thus independent of the value of the threshold voltage. As T1 operates in the saturated region ($v_{DS} \leq 2V_H$; $v_{GS} - V_T = \Delta V \leq v_{DS}$; $v_{GS} - V_T = \Delta V < v_{DS} \leq 2V_H$; $\Delta V \approx 0.5 - 1V$) the discharge current is constant, i.e. independent of the respective voltage at the capacitors and independent of the value of the threshold voltage of FET T1.

FIG. 6 shows in the example of a sensing circuit 2, another conventional fast inverter as already presented in comparable form in connection with the specification for the embodiments of FIG. 2 and FIG. 4. If the voltage at point A, i.e. the once inverted input signal, goes beneath the threshold voltage of the input FET's T11, T13 of output stage 2, this stage is switched and supplies at the output the delayed in-phase output signal $v_0$. It is finally pointed out that here as well as in the circuits of the earlier embodiments, e.g. differential amplifiers can also be used as sensing or output driver stages. The use of the given output driver stage merely offers, within the scope of the invention, particular advantages where steep rise times of the output signal are desired.

Finally, it is pointed out that the invention is not restricted to all conditions assumed in the embodiments. For instance, in so far as the terms charge and discharge have been used, a discharging can easily correspond to a charging, e.g. to negative voltages. It is also clear that instead of N-channel transistors complementary FET's or quite generally components with corresponding characteristics, e.g. operational amplifiers, can be employed. Capacitances can be generally distributed or discrete capacitors or combinations thereof. The same applies also to the time, voltage, component data, etc.

Summing up the specification it can be concluded that the invention offers the following advantages:

1. By combining transistors T1 and T2 as well as coupling capacitor C2 in accordance with this invention, longer delay times than in conventional circuits of the given type can be achieved. The circuit designer has thus at his disposal a delay circuit adaptable to many applications and showing great flexibility, which in typical cases can reach delay times increased by a factor of 2 to 5.

2. The delay stage ensures a discharge curve having a capacitance at its output, with high and constant slope—due to the voltage boost at C1 and the constant discharge current via T1—and thus permits a quick and steep passing through the switching threshold of the output stage. This ensures the rising edge of the output pulse $v_0$ will be steep.

3. The output driver can be laid out on a smaller surface with the same load, as the W/L ratio of T11 and T13 can be reduced owing to the voltage boost at their gate.

4. The overall circuit can operate with a minimum amount of additional components.

5. The delay stage can easily be designed for dynamic operation, and it then does not show any DC power dissipation when T1 is conductive, or input pulse $v_I$ reaches its upper voltage.

While the invention has been particularly shown and described with reference to the preferred embodiments thereof, it will be understood by those skilled in the art that the foregoing and other changes in form and details may be made therein without departing from the spirit and scope of the invention.

What is claimed is:

1. A delay circuit with field effect transistors which is based on the discharge of a first capacitive element caused by an input signal to be delayed;
   at least one input switching stage representing the actual delay device, said first capacitive element being effective at the output of said switching stage;
   a second switching stage in series with said input switching stage acting as a voltage sensing device and as an output driver of the input signal to be delayed, being coupled to said first capacitive element;
   a second capacitive element in the first switching stage coupling the input signal to be delayed to the previously charged first capacitive element to thus increase its precharge value;
   and means for the constant current discharge of said first capacitive element to at least the switching threshold of said series arranged second switching stage.

2. The delay circuit as claimed in claim 1 wherein the capacitance effective at the output of the input switching stage of said first capacitive element is formed by the parasitic gate capacitance of field effect transistors of said second stage.

3. A delay circuit with field effect transistors which is based on the discharge of a first capacitive element caused by an input signal to be delayed;
   at least one input switching stage representing the actual delay device, said first capacitive element being effective at the output of said switching stage;
   a second switching stage in series with said input switching stage acting as a voltage sensing device and as an output driver of the input signal to be delayed, being coupled to said first capacitive element;
   and additional charge means to additionally charge said first capacitive element to a high value from at least the switching threshold of said series arranged stage;
   said input switching stage being an inverter which comprises in series arrangement a driver and a load FET with an output at the joint connecting point, a second capacitive element being effective at said connecting point, the input signal to be delayed being coupled via said second capacitive element to the connecting point and to the gate electrode of the driver FET.

4. The delay circuit as claimed in claim 3 wherein said first capacitance effective at the output of the input switching stage of the capacitive element is formed by the parasitic gate capacitance of the field effect transistors of the series arranged stage.

5. The delay circuit as claimed in claim 4 wherein the capacitance of said first capacitive element effective at the output of the input switching stage is smaller than that of said second capacitive coupling element.

6. The delay circuit as claimed in claim 5 wherein the charging of said first capacitive element at the output of the input inverter is effected via the associated load FET up to said high value.

7. The delay circuit as claimed in claim 6 wherein the charging of said first capacitive element effective at the output of the input inverter is provided during a clock phase provided prior to the appearance of the input signal to be delayed.

8. The delay circuit as claimed in claim 7 wherein the input inverter for charging said first capacitive element is a bootstrap stage.

9. The delay circuit as claimed in claim 8 wherein the sensing and driver circuit is a bootstrap stage.

10. The delay circuit as claimed in claim 9 wherein the driver FET is operated in the saturation region during the discharging of said first capacitive element.

11. The delay circuit as claimed in claim 10 wherein during the discharging of said first capacitive element the gate voltage of the driver FET is almost constant, being raised only slightly over the value of the threshold voltage.

12. The delay circuit as claimed in claim 11 wherein a switched path of another FET is positioned between the circuit input and the gate electrode of the driver FET with the switched path of the other FET having a transfer impedance that is higher with respect to the driver FET.

13. The delay circuit as claimed in claim 12 wherein the gate electrode of the other FET is applied to a fixed voltage corresponding to the operation voltage.

14. The delay circuit as claimed in claim 13 wherein the gate electrode of the other FET is connected to the circuit input.

15. The delay circuit as claimed in claim 14 wherein a parallel FET is provided in parallel to the gate-source path of the driver FET, said parallel FET being controllable during the charging phase via a pulse applied at its gate electrode.

16. The delay circuit as claimed in claim 15 including a voltage divider stage switchable by the input signal comprising an FET simulating the driver FET with respect to its threshold voltage, the gate voltage for the driver FET following the equation $v_G = V_T + \Delta V$ being derived from said voltage divider stage, $\Delta V$ being a constant.

17. The delay circuit as claimed in claim 16 wherein the voltage corresponding to the constant $\Delta V$ is derived from a further voltage divider switchable by the input signal.

18. An FET delay circuit comprising:
an input stage having an input terminal for receiving an input signal to be delayed and an output terminal having a load capacitance;
a first FET device in said input stage, having its drain connected to said output terminal and its source connected to a reference potential;
a precharge means in said input stage, connected to said output terminal for precharging said load capacitance during a first period to a first potential;
a capacitor in said input stage, connected between said input terminal and said output terminal, having a capacitance greater than said load capacitance, for forming a capacitor divider with said load capacitance, to transmit said input signal from said input terminal to said output terminal during a second period following said first period, to boost the magnitude of said input signal at said output terminal to a second potential greater than said first potential;
a second FET device in said input stage, having its source-drain path connected between said input terminal and the gate of said first FET device, with the gate of said second FET device connected to said input terminal, for delaying the application of said input signal to said gate of said first FET device until a third period following said second period, to turn said first FET device on, discharging said load capacitance and reducing the magnitude of the voltage at said output terminal;
a driver stage having an input terminal connected to the output terminal of said input stage and an output terminal;
a third FET device in said driver stage, having its drain connected to said output terminal of said driver stage, its source connected to a reference potential, and its gate connected to said input terminal of said driver stage, for separating said load capacitance from said output terminal of said driver;
a load impedance in said driver stage connected between the output terminal of said driver stage and a drain voltage;
said magnitude of said voltage at said output terminal of said input stage during said second period being sufficiently high to cause said third FET device to conduct, generating a relatively low output voltage at said output terminal of said driver stage;
said reduction in the magnitude of said voltage at said output terminal of said input stage during said third period causing said third FET device to stop conduction, generating a relatively high output voltage at said output terminal of said driver stage, having a fast transition due to the lack of capacitive loading thereon;
whereby a delayed signal may have a fast transition time.

19. The circuit of claim 18 wherein said driver stage further comprises:
said load impedance having a fourth FET device having its drain connected to said drain voltage and its source connected to said output terminal of said driver stage;
a fifth FET device in said driver stage having its gate connected to the gate of said third FET device and its source connected to said reference potential;
a sixth FET device in said driver stage having its drain connected to said drain potential, its gate connected to the gate of said fourth FET device, and its source connected to a drain of said fifth FET device;
a bootstrap capacitor connected between the gate and the source of said sixth FET device;
said gate of said sixth FET device being connected to said input terminal of said input stage;
whereby a portion of said input signal precharges said bootstrap capacitor prior to said third period, enabling said driver stage to operate as an unloaded bootstrap driver.

20. The FET delay circuit of claim 19, which further comprises:
a switching stage having an input terminal connected to said input terminal of said input stage and an output terminal connected to said gate of said sixth FET device;
a seventh FET device having its source-drain path connected between said input terminal of said switching stage and said output terminal of said switching stage;
circuit means in said switching stage connected to the gate of said seventh FET device, for rendering said seventh FET device conductive prior to said third period and non-conductive during said third period;

whereby a portion of said input signal may be transmitted to said gate of said sixth FET device to precharge said bootstrap capacitor.

21. The FET delay circuit of claim 20 wherein said circuit means and said switching stage further comprises:
a precharge capacitor connected between the gate and the input terminal of said switching stage;
a precharging means connected to the gate of said seventh FET device, for precharging said precharge capacitor prior to said third period, thereby rendering said seventh FET device conductive;
an impedance element connected to the gate of said seventh FET device, for slowly discharging said precharged condition of said precharge capacitor prior to said third period;
whereby said seventh FET device is conductive prior to said third period and is non-conductive during said third period.

22. The FET delay circuit of claim 19 wherein said precharge means of said input stage further comprises:
a saturated low enhancement mode field effect transistor.

23. The FET delay circuit of claim 22 wherein said input stage further comprises:
an FET device having its source-drain path connected between the gate of said first FET device and a reference potential, with its gate connected to a signal which is on prior to said second period;
whereby the gate of said first FET device may be discharged prior to said second period.

24. The FET delay circuit of claim 19 wherein said precharge means in said input stage further comprises:
an enhancement mode field effect transistor having its gate connected to an enabling pulse which is on prior to said second period.

25. The FET delay circuit of claim 18 wherein said input stage further comprises:
an FET device having its source-drain path connected between the gate of said first FET device and a reference potential with its gate connected to a signal which is on prior to said second period;
whereby the gate of said first FET device may be discharged prior to said second period.

* * * * *